United States Patent
Stark

(10) Patent No.: US 9,264,037 B2
(45) Date of Patent: Feb. 16, 2016

(54) KEYBOARD INCLUDING MOVEMENT ACTIVATED OPTICAL KEYS AND RELATED METHODS

(75) Inventor: Laurence Stark, Edinburgh (GB)

(73) Assignee: STMICROELECTRONICS (RESEARCH & DEVELOPMENT) LIMITED, Marlow Bucks (GB)

(*) Notice: Subject to any disclaimer, the term of this patent is extended or adjusted under 35 U.S.C. 154(b) by 217 days.

(21) Appl. No.: 13/243,654

(22) Filed: Sep. 23, 2011

(65) Prior Publication Data
US 2012/0162081 A1 Jun. 28, 2012

(30) Foreign Application Priority Data
Nov. 30, 2010 (GB) .................... 1020283.6

(51) Int. Cl.
| H03K 17/96 | (2006.01) |
| G06F 3/02 | (2006.01) |
| G06F 3/041 | (2006.01) |
| G06F 3/042 | (2006.01) |
| G06F 3/0488 | (2013.01) |
| H03K 17/94 | (2006.01) |

(52) U.S. Cl.
CPC .......... *H03K 17/9629* (2013.01); *G06F 3/0202* (2013.01); *G06F 3/042* (2013.01); *G06F 3/0416* (2013.01); *G06F 3/04883* (2013.01); *G06F 3/04886* (2013.01); *H03K 17/943* (2013.01); *G06F 2203/0338* (2013.01); *G06F 2203/04109* (2013.01)

(58) Field of Classification Search
CPC ............ G06F 2203/0338; G06F 3/042; G06F 2203/04109
USPC .......................................................... 345/168
See application file for complete search history.

(56) References Cited

U.S. PATENT DOCUMENTS

| 4,254,333 A | 3/1981 | Bergstrom | |
| 5,408,621 A | 4/1995 | Ben-Arie | |
| 5,486,058 A | 1/1996 | Allen | |
| 6,031,942 A * | 2/2000 | Nakayama ......... G06K 9/00087 382/124 |
| 2003/0044054 A1* | 3/2003 | Olschewski et al. .......... 382/128 |
| 2007/0247337 A1 | 10/2007 | Dietz et al. | |
| 2008/0042980 A1* | 2/2008 | Bowen .......................... 345/168 |
| 2008/0084388 A1* | 4/2008 | Ahn ............................... 345/158 |
| 2009/0189878 A1* | 7/2009 | Goertz et al. .................. 345/175 |
| 2010/0020157 A1* | 1/2010 | Jelinek et al. .................... 348/36 |
| 2010/0149092 A1* | 6/2010 | Westerman et al. .......... 345/156 |
| 2010/0164879 A1 | 7/2010 | Doktorova et al. | |
| 2010/0302169 A1* | 12/2010 | Pance et al. ................... 345/170 |
| 2011/0063224 A1* | 3/2011 | Vexo et al. .................... 345/168 |
| 2011/0175804 A1* | 7/2011 | Grover .......................... 345/156 |
| 2011/0298711 A1* | 12/2011 | Dean et al. .................... 345/161 |
| 2012/0081283 A1* | 4/2012 | Lee et al. ....................... 345/157 |
| 2012/0112998 A1* | 5/2012 | Morris et al. .................. 345/157 |

* cited by examiner

Primary Examiner — Koosha Sharifi-Tafreshi
Assistant Examiner — Chun-Nan Lin
(74) Attorney, Agent, or Firm — Allen, Dyer, Doppelt, Milbrath & Gilchrist, P.A.

(57) ABSTRACT

A keyboard may include a plurality of optical keys. Each optical key may include an optical module and an interaction surface. The optical key may be configured to be activated based on movement of an object on or adjacent the interaction surface. Each movement may produce a different output from the optical module to thereby generate a predetermined input for a device.

29 Claims, 16 Drawing Sheets

IMAGE-FRAME N          IMAGE-FRAME N+1

FILTERED IMAGE-FRAME N     FILTERED IMAGE-FRAME N+1

FILTERED IMAGE-
FRAME N+1-SHIFT LEFT

FILTERED IMAGE-
FRAME N+1-SHIFT RIGHT

FILTERED IMAGE-
FRAME N+1-SHIFT UP

FILTERED IMAGE-
FRAME N+1-SHIFT DOWN

KEYBOARD INCLUDING MOVEMENT ACTIVATED OPTICAL KEYS AND RELATED METHODS

FIELD OF THE INVENTION

The present invention relates to an improved keyboard or keypad.

BACKGROUND OF THE INVENTION

The increasing complexity of computer and mobile systems has led to a corresponding increase in the number of inputs which can validly be entered into a parent device using a keyboard (the word keyboard when used herein is intended to encompass all keyboards and keypads). In addition, the number of commands available to the user has also increased. However, a keyboard has a set number of keys, thus multiple functions and entries may be mapped to each individual key. For example on the keypad of a typical mobile phone the center key can be used to enter seven different inputs (namely 5, j, k, l, J, K, and L).

The keys of a conventional keyboard may have only digital sensing capability—they are either on or off. As a result, once a command and/or input is mapped to a particular key, cumbersome additional context-sensitive commands or key combinations may be used by the user to identify the intended input/command. This in turn reduces the speed at which data can be entered using conventional keys of a keyboard.

One attempt to address this problem has been to provide keyboards and keypads with dedicated programmable keys, which can be mapped to a particular input or function by a user. However, the additional space requirement of such keys may be undesirable for applications where space for an input device is limited e.g., laptop keyboards, mobile phone keypads, etc.

SUMMARY OF THE INVENTION

An object of the present invention is to mitigate or address some of the problems identified with the prior art and to provide a keyboard which is faster, more efficient, and provides more flexibility than existing solutions.

According to a first aspect of the present invention a keyboard may include a plurality of optical keys, each comprising an optical module and an interaction surface. The optical key can be activated in one or more ways based on movement of an object on or in the vicinity of the interaction surface. Each movement may produce a different output from the optical module to thereby generate a predetermined input for a device.

Optionally, the keyboard further comprises a key event handler. The outputs from the optical modules are passed to the key event handler to determine a sequence of movements and associated keys.

Optionally, the key event handler is configured to generate the predetermined input based on the movement and associated key combination. Optionally, the optical module can be activated by one or more of the following: detection of a position of the object relative to the interaction surface, detection of movement of the object and, and detection of the direction of movement of the object.

Optionally, the optical module comprises a photo detector array. Optionally, the keyboard further comprises an illumination source. Optionally, the optical module comprises a waveguide layer. Optionally, the keyboard further comprises a comparator for determining a motion vector from two images based on the differences between the two images.

Optionally, the optical modules are electrically connected in parallel with each other to the key event handler via a bus. Alternatively, the optical modules are electrically connected in a daisy-chained serial configuration to the key event handler via a bus.

Optionally, the optical keys are arranged in a single continuous sensing area. The movement or position of an object in the sensing area may be determined by the key event handler for navigational purposes.

Optionally, the key event handler may be configured to interpolate the position of a moving object over the continuous sensing area when the object is between two specific optical keys. Optionally, the key event handler may derive the speed of movement of the object, and the speed of movement of the object may be used at least in part to interpolate the position of the object.

According to a second aspect of the present invention a device may includes a keyboard in accordance with the present disclosure. Optionally, the device is a computer. Optionally, the device is a telephone.

According to a third aspect of the present invention there a method aspect is directed to a method of generating an input to a device from a keyboard. The keyboard comprises a plurality of optical keys comprising an optical module and an interaction surface. The optical key may be activated in one or more ways based on movement of an object on or in the vicinity of the interaction surface. The method may include generating a predetermined input to the device when at least one optical module has been activated by movement of an object. Each movement produces a different output from the optical module to thereby generate the predetermined input to the device.

Optionally, the method further comprises passing the outputs from the optical modules to a key event handler to determine a sequence of movements and associated keys. Optionally, the method further comprises generating a predetermined input to a device based the sequence of movements and associated keys.

Optionally, the optical keys are arranged in a single continuous sensing area, and the method comprises determining the movement or position of an object in the sensing area for navigational purposes. Optionally, the method further comprises interpolating the position of a moving object over the continuous sensing area when the object is between two specific optical modules. Optionally, the method further comprises deriving the speed of movement of the object and using the speed of movement of the object at least in part to interpolate the position of the object.

According to a fourth aspect of the present invention a computer program may include instructions for carrying out the steps of a method in accordance with the present disclosure. Thus, the present embodiments provide each key with analog sensing capabilities, which may be exploited (e.g. multi-purpose keys using swipe direction to determine the command) to give the user an extra dimension of control in addition to possessing all of the standard keyboard functionality.

DETAILED DESCRIPTION OF THE PREFERRED EMBODIMENTS

FIGS. 1A-1D show a key 110 comprising an optical module 112 and an interaction surface (not shown). The key 110 is referred to herein as an optical key.

It should be noted that the terms "optical", "illumination" and "light" are intended to cover other wavelength ranges in the spectrum and are not limited to the visual spectrum. The term a keyboard is intended to cover any type of keyboard or keypad having a plurality of keys arranged in an array, appropriate to a device for which the keyboard acts as an input. Any number or orientation of the keys can be used.

The optical module 112 preferably comprises an array of photo detectors, an illumination source (such as a light emitting diode (LED), laser, or the like) and appropriate optics (as described below) so as to generate an image of an object on or in the vicinity of the interaction surface (not shown) of the key 110. The photo detectors may be fabricated as part of a microchip. In this way an image of an object may be generated, for example, a user's finger 100, when it is placed in contact with or in close proximity to the interaction surface. Through computation, via a software or firmware algorithm, the presence of an object is detected. Preferably, the computation is performed by the microchip comprising the photo detectors. If the object is moving, its movement is tracked by the movement of the outline of the object, or preferably, if the object is a finger, by tracking the movement of the fingerprint ridges of the finger when the object is proximate to the interaction surface.

The interaction surface is a surface which allows light through so that bodies situated on or in the vicinity of the interaction surface can be detected by the optical module 112. The interaction surface may be located between the optical module and the exterior of the optical key. The interaction surface is preferably located on the face of the optical key which faces away from the keyboard (i.e., the face with which a user will interact with), and can also function as a protective barrier to reduce the ingress of dirt or moisture to the optical module. The interaction surface is preferably formed from a resilient material, which may have a reduced susceptibility to damage through being touched by an object, such as a finger 100 or other pointer.

Figure 1A:
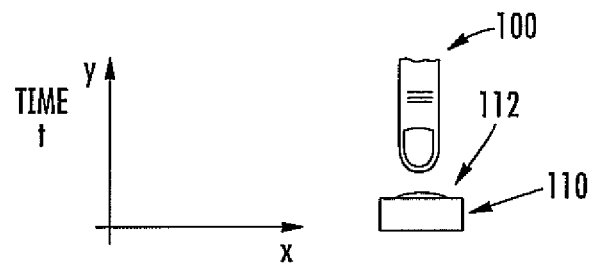
FIGS. 1A-1D are diagrams of a user's finger relative to a key including an optical module and corresponding image/time graph in accordance with the present invention.

In FIG. 1A, a user's finger 100 is not proximate to the optical key 110. As a result, an image of a user's finger 100 cannot be captured with sufficient clarity to allow the extraction of the features of the finger 100, and, hence, the finger 100 is not detected in the present embodiment. In other embodiments where features of the finger 100 or pointer are not so critical, detection may be achieved by the mere presence of the finger 100 or pointer as described below.

Figure 1B:
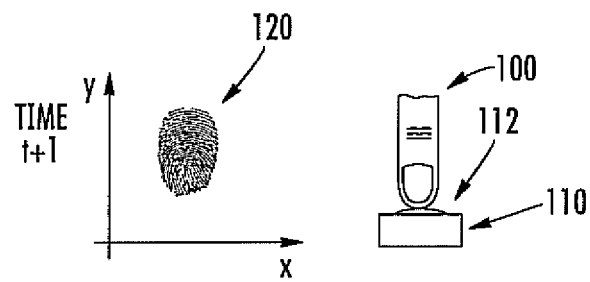

In FIG. 1B, the user's finger 100 has been moved proximate to the optical key 110. As a result, an image of the user's finger 100 can be captured with sufficient clarity activate the optical module to allow the extraction of the features of the finger 100, and, hence, the finger 100 is detected. Detection of the finger 100 is determined by a feature extraction algorithm which is performed on the image captured by the optical module 112. The detection of an object proximate to the optical key 110 generates a keystroke signal in a similar manner to pressing a key of a conventional keyboard.

It should be noted that the present embodiments are capable of detecting presence of a pointer on or in the vicinity of the interaction surface. Also, for certain detectors, relative movement of the pointer between two positions can also be determined. This enables each key on the keyboard to be capable of recognizing more than one input for each key. This is explained in greater detail below.

Figure 2:
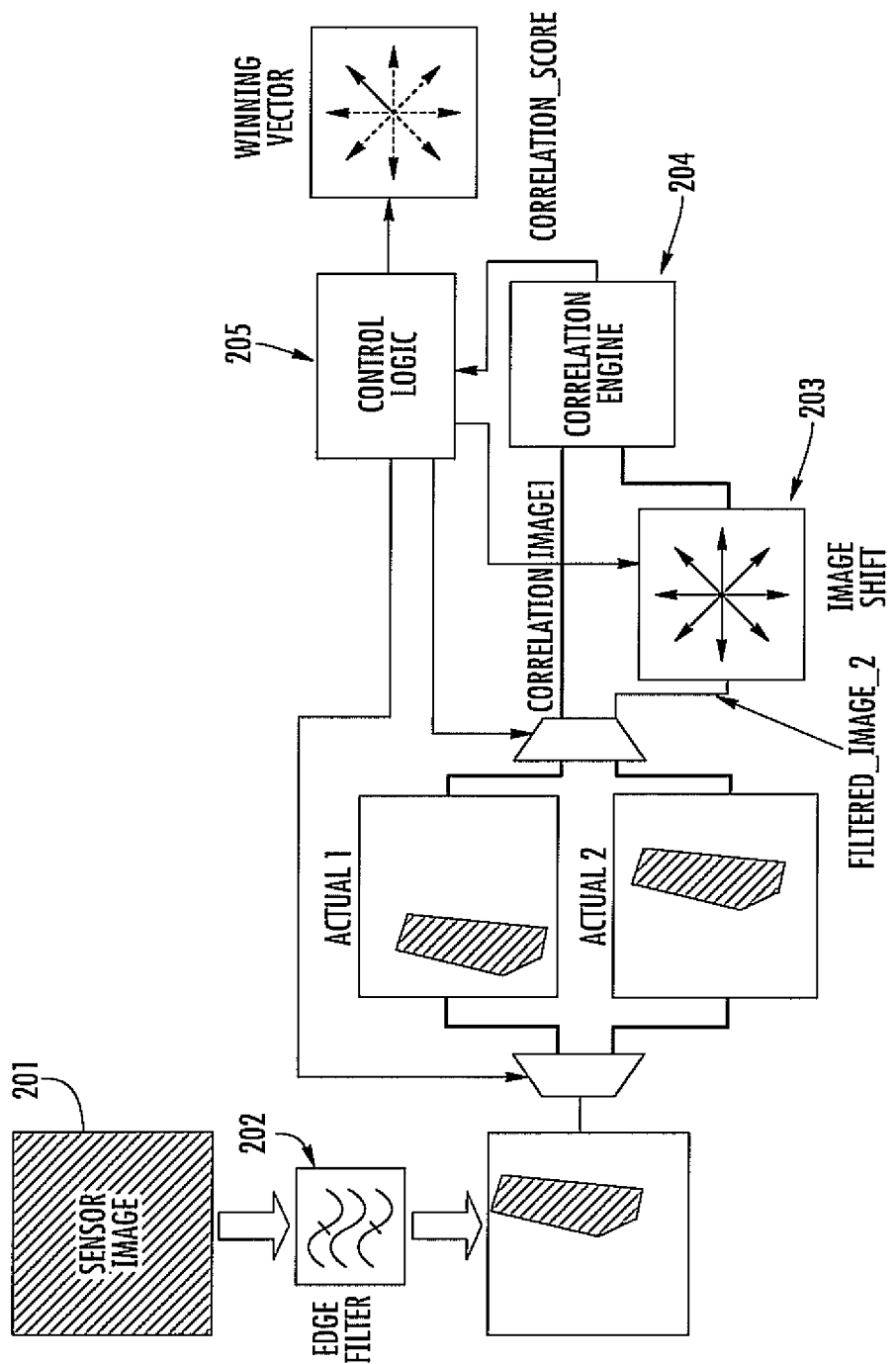
FIG. 2 is a schematic diagram illustrating a signal path for processing the output of photo diodes in accordance with the present invention.
Figure 3A:
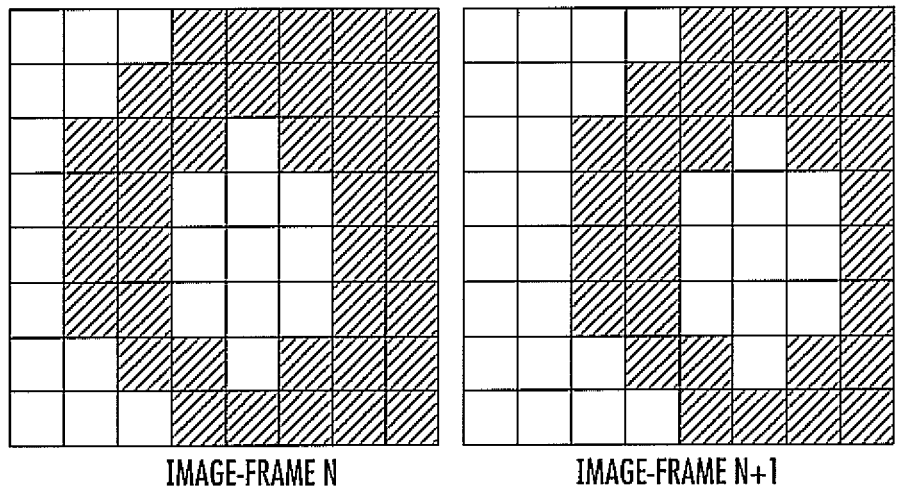
FIG. 3A is a diagram of first and second images from two consecutive frames taken by a photo detector of the present invention.

FIG. 2 shows an overview of the signal path. In step 201, the photo detector takes an image. Preferably, the photo detector array takes two images per frame—one with the illumination source off (to generate a "Black" image) and one with it on (to generate an "Exposed" Image). The "Black" image is subtracted from the "Exposed" image to remove any fixed pattern and reset noise (aka "kTC" noise). FIG. 3A shows two sequential images obtained in such a manner.

Figure 3B:
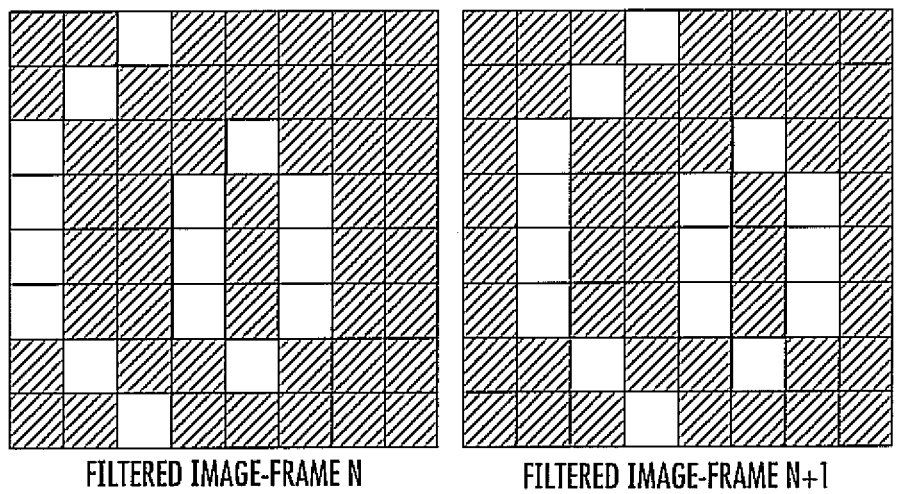
FIG. 3B is a diagram of the first and second images of FIG. 3A after filtering.

Although, in theory, images can be compared, it may be increasingly difficult to provide even illumination across the image plane. Therefore, a filter (hereafter referred to as an edge filter) is preferably applied in step 202 to remove low spatial frequency variations and enhance high spatial frequency variations. With such a filter, gradual variations of illumination are removed, and the system is tolerant to uneven illumination. FIG. 3B shows the two sequential images shown in 3A after filtering.

To determine a motion vector between the latest and previous edge filtered images, the two edge-filtered images are compared. There are many ways to compare the images.

An increasingly efficient way is to use the motion vector previously determined as a first estimate of the motion between the two edge filtered images. One edge filtered image is then shifted in step 203 using this motion vector (Xshift, Yshift) to produce a shifted image. The other edge filtered image is used as a reference image. The shifted image and reference image are compared with each other in step 204. The comparison typically uses the sum of absolute differences (SAD). This involves comparing each pixel in the shifted image with each corresponding pixel in the reference image and summing the absolute differences between the pixels. One possible algorithm is set out in the following pseudo-code:

```
CI2 = ImageShift (Filtered_Image_2, Xshift, Yshift)
CI1 = Filtered_Image_1
SAD=0
For Y= 0 to YMAX
    For X= 0 to XMAX
        SAD = SAD + ABS (CI1 (X,Y) – CI2 (X,Y) )
    Next X
Next Y
```

Figure 3C:
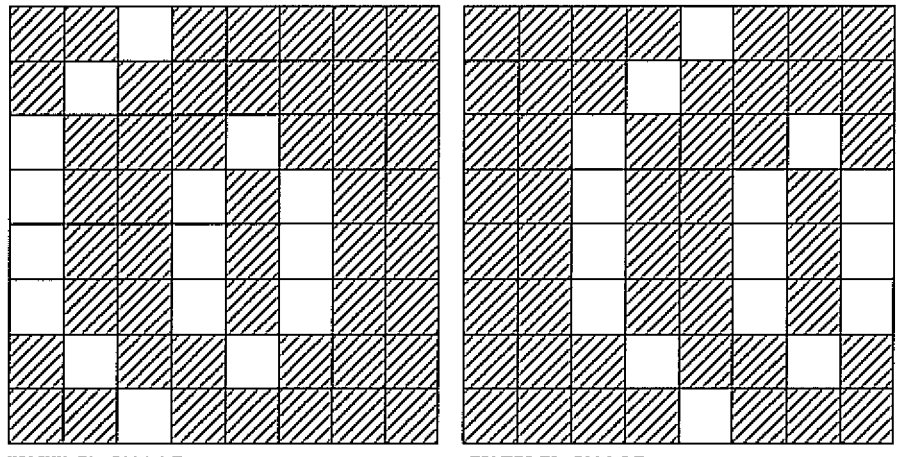
FIG. 3C is a diagram of the second image of FIG. 3B shifted left, right, up, and down, respectively.
Figure 3C:
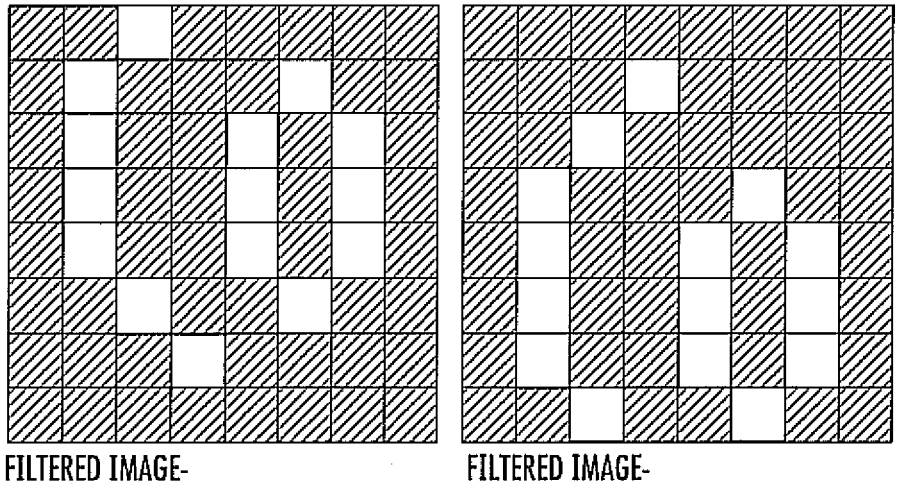

The resulting SAD is stored, and the Xshift and Yshift are varied as shown in FIG. 3C and another SAD is computed. Control logic 205 is used to determine the lowest SAD, which equates to the situation where the two images (CI1 and CI2) are most similar. In this case, the shift applied to obtain CI2 is taken as the motion vector between the two images.

It should be noted that in FIGS. 3A, 3B and 3C, the contrast has been enhanced for clarity of the figures to obtain black (0% signal) or peak white (100%) signals. In practice, a range of signal between 0% and 100% are detected. Furthermore, the image shifts shown in these figures are in integral pixels. In practice, the image may be shifted by a fraction of a pixel using interpolation.

The orientation of the distal phalanges of the fingers 100 when typing using a keyboard is often perpendicular to the plane of the keyboard, presenting a fingerprint 120 where the friction ridges of the fingertip image captured by the optical module appear to be predominantly horizontal. If the user were to use one of the keys for navigational purposes, the appearance of the vertically oriented friction ridges can be used to distinguish between accidental and deliberate directional motion of the finger 100.

Figure 4A:
FIGS. 4A and 4B are greatly enlarged diagram of portions of a typical finger print.
Figure 4B:

FIGS. 4A and 4B show the pattern of a typical fingerprint. When typing, a user normally uses the tips of their fingers to press the buttons, and typically the horizontal ridges highlighted in box 410 of FIG. 4A will be detected. However, when a user swipes a finger across the key, the ball or center region of the finger is generally used. This typically has a different pattern of ridges, usually vertical or diagonal, as highlighted in box 420 of FIG. 4B, and, thus, a different pattern of ridges may be detected. Hence, by analyzing the orientation of the detected ridge pattern, it may be possible to determine if the tip of the user's finger is present (and therefore a "straight" key press) or the ball/center of the user's finger is present (and therefore a directional key "swipe" has occurred).

There are many methods known to analyze the direction of a pattern. For example, a Fourier or fast Fourier transform (FFT) can be performed on the image in a first direction and another Fourier or fast Fourier transform can then be performed in a second direction, perpendicular to the first direction. If the ridges are parallel to the first direction, then the Fourier or fast Fourier transform performed in this direction produces, a signal which is DC/low frequency, whereas the Fourier or fast Fourier transform performed along the second direction shows a larger signal in higher spatial frequencies.

Figure 5:
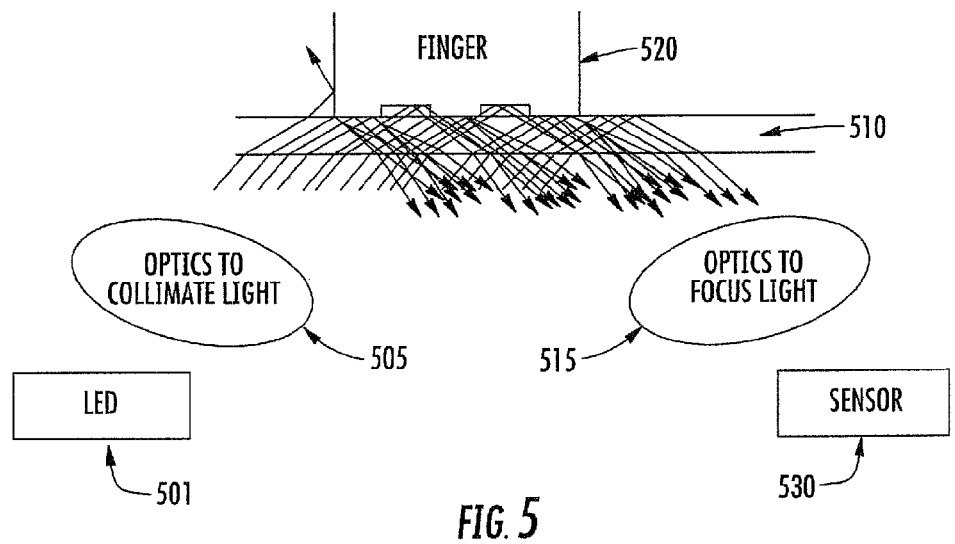
FIG. 5 is a schematic diagram of an optical module using a standard photo detector set up in accordance with the present invention.

FIG. 5 shows one embodiment of an optical module which uses a standard photo detector set up. An LED 501 is used as the illumination source. The light from the LED 501 is directed towards the interaction surface 510 at an angle. A set of optics 505 is used to collimate the light from the LED 501. One or more lenses, one or more mirrors, one or more prisms or any combination thereof can be used to achieve this. The light passes through the interaction surface 510, and if an object, such as a finger 520 is present, light will be reflected back through the interaction surface 510. A sensor 530 comprising photo diodes is positioned to receive reflected light. Preferably, a set of optics 515 is used to focus reflected light on to the sensor 530. One or more lenses, one or more mirrors, one or more prisms or any combination thereof can be used to achieve this.

Background objects, which are not proximate to the optical key 110 are not cleanly reflected and may appear blurred in the captured image. As a result, insufficient features may be present in the image to indicate the presence of the user's finger 100, and, thus no finger is detected in this case. Thus, background objects may not interfere with the detection of an object proximate to the optical key 110.

In another embodiment, the optical module 112 used in the key may alternatively or additionally utilize the frustrated total internal reflection (FTIR) principle. In this case, a mechanical switch may be located on the underside of the optical module to detect a direct finger press, or the sensor may detect deformations in the ridges of a user's finger caused by the application of pressure by the user to determine a direct key press.

Figure 6:
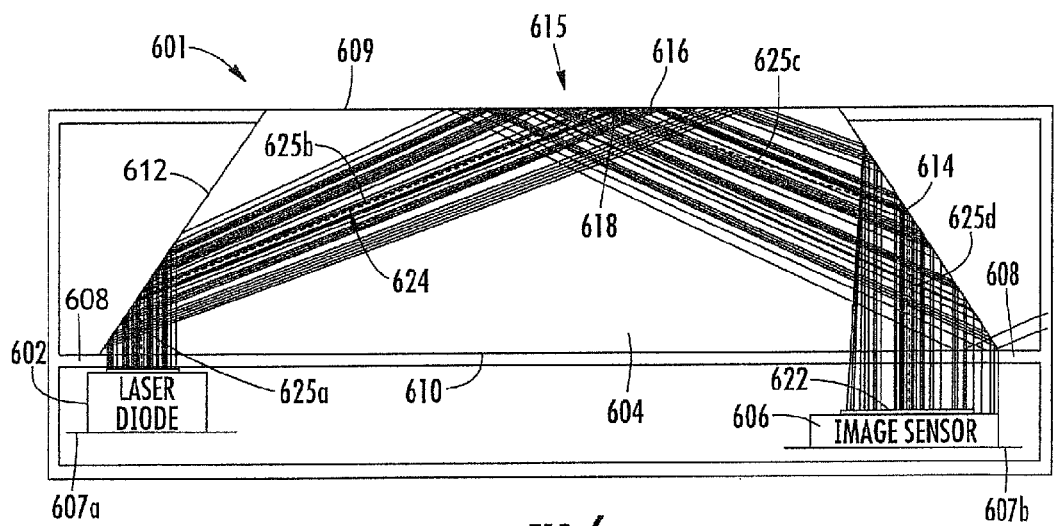
FIG. 6 is a schematic cross sectional view of an optical module which uses frustrated total internal refraction in accordance with the present invention.

FIG. 6 is a schematic cross sectional view of an optical module 601 which utilizes the FTIR principle. The optical module 601 comprises a laser diode 602 as an illumination source, an optical waveguide layer 604 and an image sensor 606. The image sensor 606 preferably comprises photo detectors. The laser diode 602 and image sensor 606 are mounted on separate circuit boards 607a, 607b, while the optical waveguide layer 604 is suspended above the circuit boards 607a, 607b by a supportive housing 608. It should be understood that the laser 602 and image sensor 606 may alternatively be mounted on the same circuit board.

Figure 7:
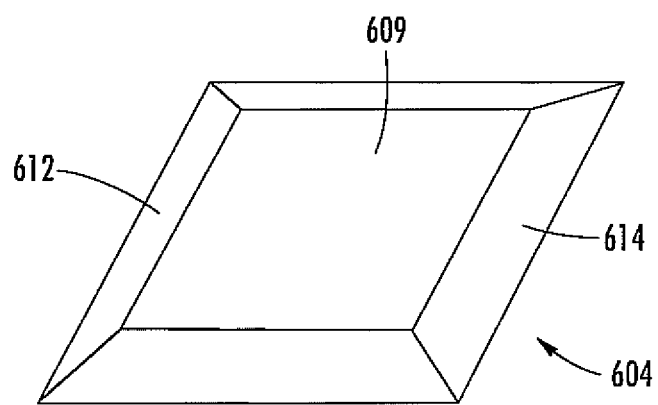
FIG. 7 is a schematic perspective view of the waveguide layer of the optical module of FIG. 6.

As shown in FIGS. 6 and 7, the optical waveguide layer 604 comprises an upper, user input face 609, and a lower face 610 with a pair of angled side faces 612, 614 extending between them. The side faces 612, 614 converge towards each other as they extend from the lower face 610 to the upper face 609. A touch sensitive input pad 615 is formed at an intermediate region of the user input face 609 between the angled faces 612, 614. The input pad 615 has an interaction surface 616, which is exposed to the ambient environment, and a total internal reflection (TIR) surface 618, which is internal to the waveguide layer 604, on the underside (that is, the reverse side) of the exposed interaction surface 616. The waveguide layer 604 typically has a refractive index in the range 1.5-2.0 and may be formed, for example, from polycarbonate (refractive index approximately 1.59).

The laser 602, image sensor 606, and waveguide layer 604 are together arranged such that when radiation 624 is emitted by the laser 602, it enters the waveguide layer 604 and is directed onto the imaging surface 622 of the image sensor 606 via the TIR surface 618 by total internal reflection. In one embodiment, the angled surfaces 612, 614 are also TIR surfaces. In this case, radiation is emitted by the laser 602 along a first principal optical axis 625a towards a first one of the angled faces 612 of the optical waveguide layer 604. The first angled face 612 then directs the radiation 624 towards the TIR surface 618 along a second principal optical axis 625b by total internal reflection. The radiation 624 is then totally internally reflected by the TIR surface 618 along a third principal optical axis 625c towards the second angled face 614. Finally, the second angled face 614 totally internally reflects the radiation 624 along a fourth principal optical axis 625d towards the imaging surface 622 of the image sensor 606. It should be understood that, in each case, the laser radiation is incident on the TIR surfaces at an angle greater than the critical angle for total internal reflection.

As shown in FIG. 6, the waveguide layer 604 is arranged such that the radiation reflected by the side face 614 is not totally internally reflected by the lower face 610 of the waveguide layer 604. Rather, the radiation passes through the lower face 610 onto the imaging surface 622, thus, may cause substantially all of (or only some of, but preferably at least the majority of) the pixels of the pixel array to be illuminated.

In the embodiment shown in FIG. 6, the laser diode 602 and the image sensor 6 have principal optical axes 625a, 625d, respectively, which are substantially parallel to each other. As such, the circuit boards 607a, 607b on which the laser 602 and image sensor 606 are mounted may be co-planar, or, alternatively, they may be located on separate parallel planes.

As explained below, the position and surface area of the touch sensitive input pad 615 is defined by the area of the user input face 609 which is illuminated by the laser 602. This depends on the divergent angle of the laser beam (in this case approximately 10°), the angle at which the laser beam is incident on the first angled face 612 and the degree of incline of the first angled face 612 relative to the user input face 609. It will be understood that, in an alternative embodiment, the optical waveguide layer may be arranged such that the entire user input face 609 is illuminated by the laser radiation (and is thus touch sensitive).

In some cases, the geometry of the waveguide layer 604 (in particular the degree of incline of the angled faces 612, 614 relative to the principal optical axis 625a, 625c of the laser radiation incident thereon) may be such that the laser radiation is incident upon the angled faces 612, 614 at an angle less than the critical angle for total internal reflection. In this case, a reflective coating (e.g. aluminium) may be applied to the angled faces 612, 614 to increase their reflectivity so that they can reflect the radiation emitted by the laser towards the input pad 615 and the image sensor 606 respectively.

As mentioned above, total internal reflection by the TIR surface 618 of the input pad 615 (and by the angled faces 612, 614) may be possible because the laser radiation beam is incident on the TIR surface(s) at an angle greater than the critical angle for total internal reflection. The critical angle ($\theta_c = \sin^{-1}(n2/n1)$) is dependent on the refractive index (n1) of the waveguide layer 604 and the refractive index (n2) of the ambient air on the exposed interaction surface 616.

Figure 8:
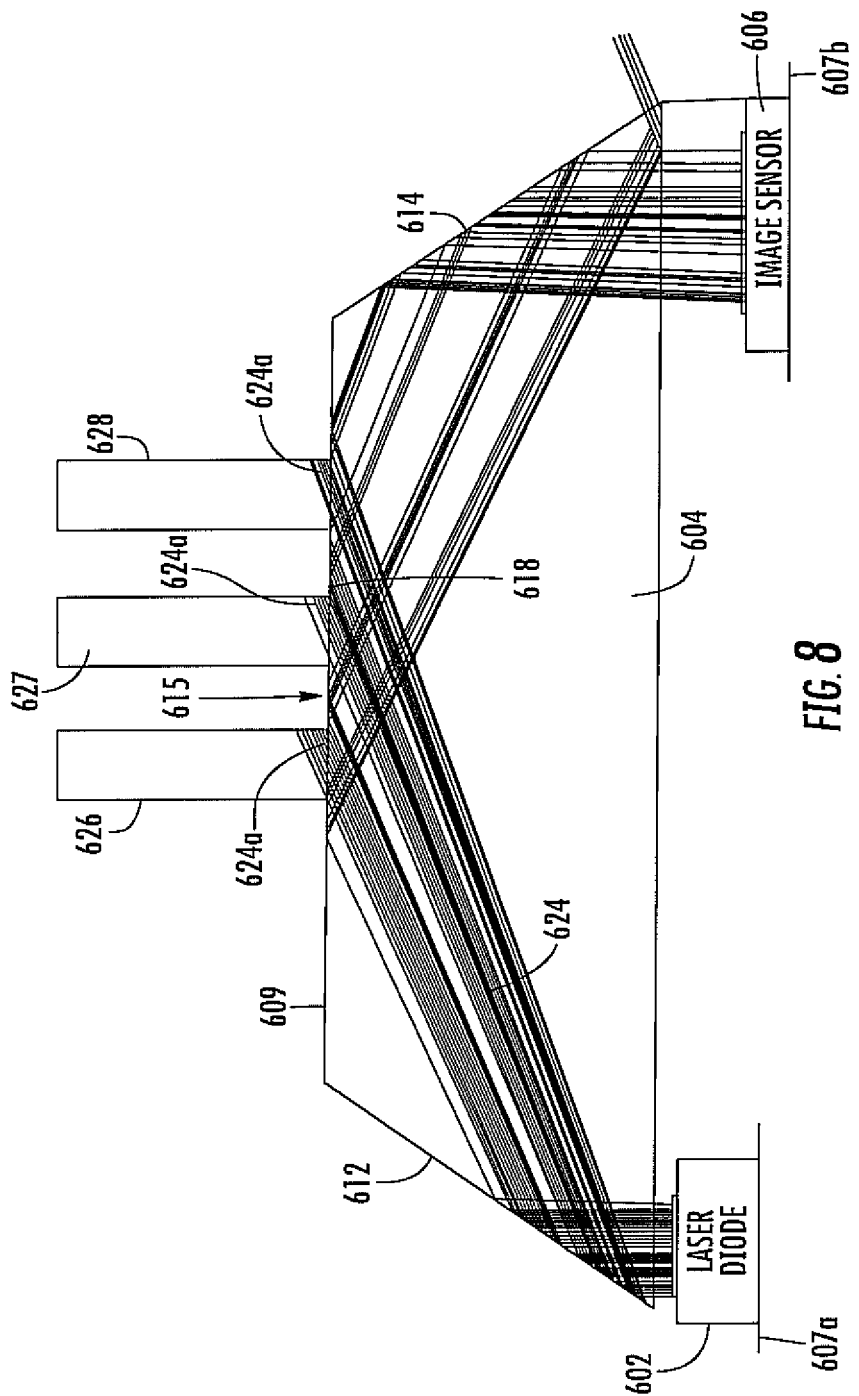
FIG. 8 is a schematic cross sectional view of an optical module including an object touching an exposed user surface of the optical module in accordance with the present invention.

However, as shown in FIG. 8, when a human digit, such as a finger or a thumb, which has a larger refractive index than the ambient air, touches the exposed interaction surface 616, the ridges 626-628 of the finger (or thumb) print frustrate the total internal reflection (FTIR) at the TIR surface 618. That is, as shown in FIG. 8, the portion 624a of radiation 624 which is incident on the TIR surface 618 directly beneath where the digit contacts the exposed interaction surface 616 is no longer totally internally reflected, and instead, escapes from the waveguide layer 604. This occurs because the increased refractive index (compared to that of the ambient air) of the digit touching the exposed user surface 16 increases the critical angle for total internal reflection above the angle of incidence of the laser radiation beam.

Although not shown in FIG. 8, a portion (typically around 10%) of the escaped radiation 624a is scattered off the digit back into the waveguide layer 604 towards the second angled face 614 and onto the imaging surface 622. In addition, any radiation which does not undergo FTIR is directed onto the imaging surface as before. However, less radiation is incident on the image sensor when a digit is in contact with the input pad 615, resulting in fewer of the pixels in the pixel array being illuminated. This causes an image pattern 630 to be formed on the imaging surface 622.

Figure 10:
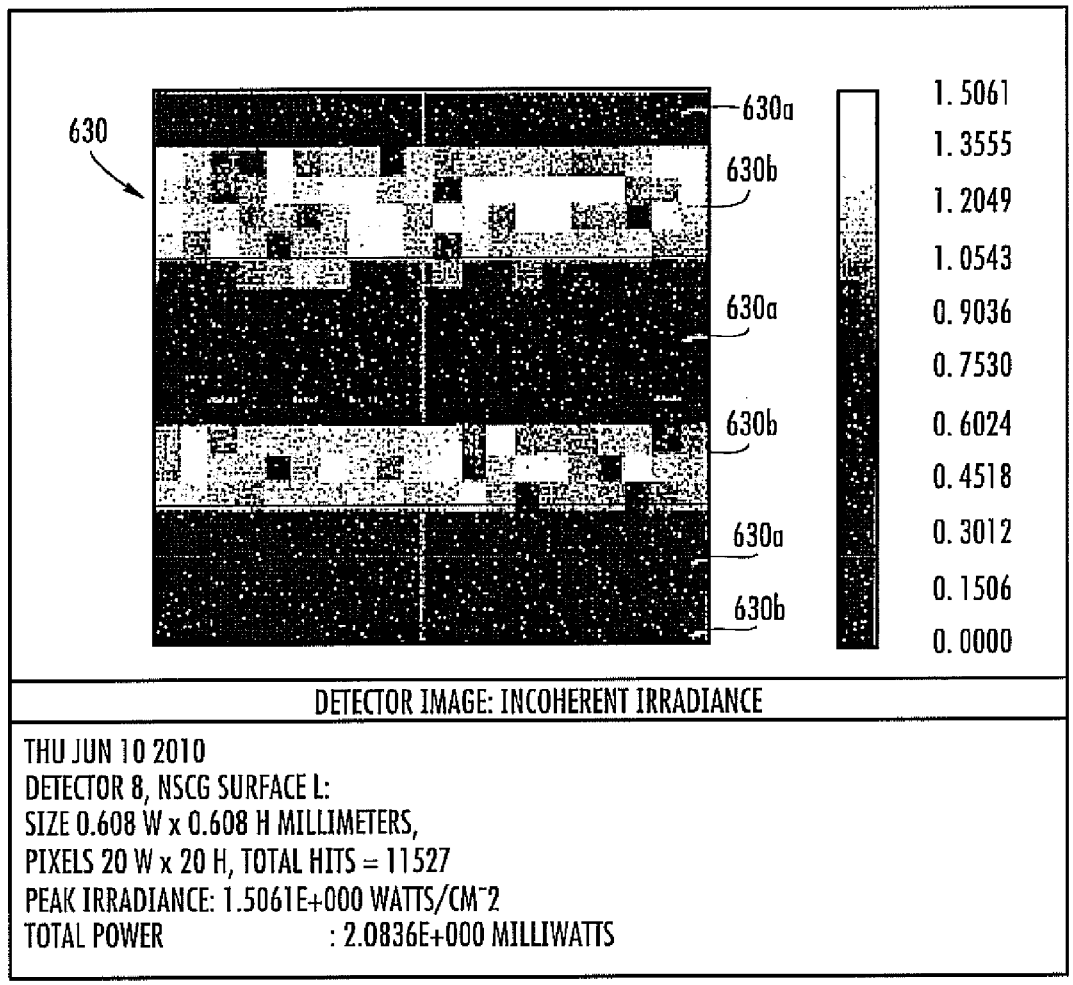
FIG. 10 is an image pattern diagram produced by an image sensor when an object touches the exposed user surface in accordance with the present invention.

An exemplary image pattern is shown in FIG. 10. In this case, a 20×20 pixel array (which in total has a width of 0.608 mm and a height of 0.608 mm) is illuminated with a peak irradiance of 1.5 W/cm² and a total power of 2.1 mW. The frustrated total internal reflection (caused by the digit ridges touching the exposed user surface) at the TIR surface 618 results in the detection of an image pattern comprising a series of dark and illuminated regions 630a, 630b.

The optical module 601 can be operated by sliding a digit 628 across the touch sensitive exposed interaction surface 616 and user input information is derived from changes in sequential image frames detected at the imaging surface as previously described with respect to FIGS. 2 and 3. In particular, as the digit 628 moves across the surface, the position of F-TIR on the input pad 615 changes and the image pattern formed on the imaging surface 622 changes accordingly. The optical module may work at a frame rate of 1 kHz to 10 kHz to detect relative movement or movements of one or more features at the exposed interaction surface 616 of the input pad 615. The frame rate is set by the refresh rate of the sensor. The exposure may be achieved by a pulsating laser source or by sampling the sensor output at the required rate. The features detected by the sensor may be between around 0.5 mm and 30 μm in size. The smaller features provide a greater ability to detect motion than the larger ones.

It may be possible to calibrate the sensor by determining the sensor illumination when the laser diode 602 is turned off and comparing this with the sensor, when the laser diode 602 is on. This calibration may occur at the start of each use of the optical navigation device or on a frame to frame basis.

Figure 9:
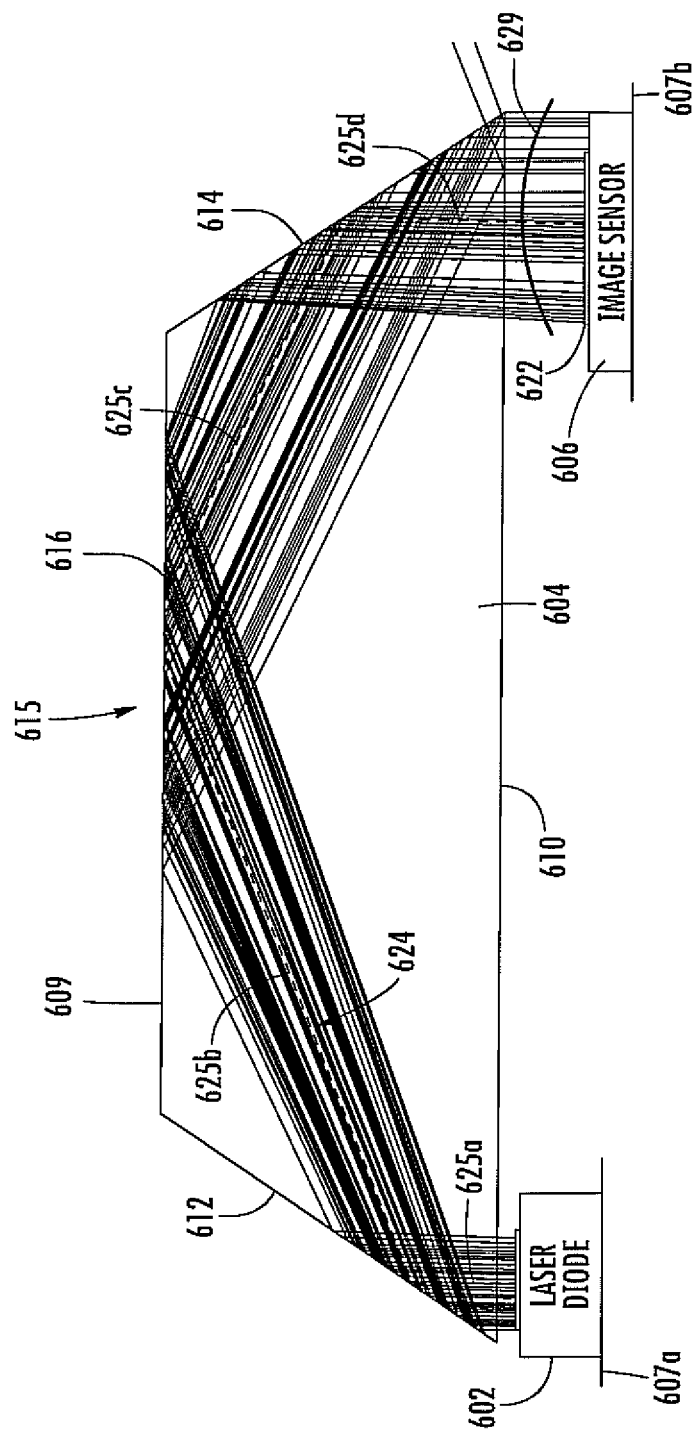
FIG. 9 is a schematic cross sectional view of an optical module including a magnifying lens adjacent the image sensor of the optical module in accordance with the present invention.

As the radiation beam emitted by the laser diode has low beam divergence (less than 10° typically), no collimation or imaging optics is typically desired. This allows the navigation device to be much thinner than conventional devices which use optics, such as lenses and collimators. It also reduces part count and makes manufacture easier. However, depending on the geometry of the device, it may be desirable/beneficial to include a magnifying lens 629 (see FIG. 9) between the waveguide layer 604 and the imaging surface 622 to ensure that the entire imaging surface is illuminated so as to form a reliable imaging pattern. In the embodiment shown in FIG. 9, the magnifying lens 629 is convex with respect to the incident direction of the laser radiation.

It is noted that, instead of a user's digit, any other suitable object (for example a glove or stylus) may be used to provide the input by causing FTIR. Such an object should have a refractive index (which is greater than 1 and) which is sufficiently large to increase the critical angle above the angle of incidence of the laser radiation beam on the TIR surface 618. Although the upper, input face 609 is shown as being substantially flat in FIGS. 6-10, it is noted that, for ergonomic reasons, it may be preferable for the upper, input face to be curved to form a dome protruding from the top of the optical navigation device.

Figure 11:
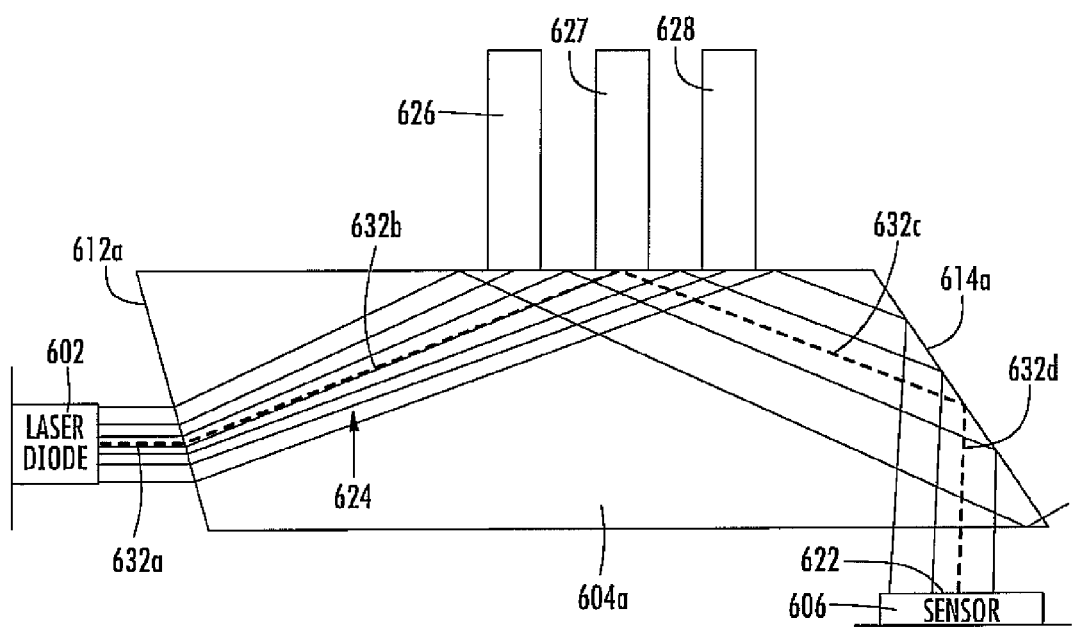
FIG. 11 shows is a schematic diagram of an optical module wherein the laser and image sensor have principal optical axes which are oriented at approximately 90° to each other in accordance with the another embodiment of the present invention.

FIG. 11 shows an alternative embodiment of the optical module 601, which comprises an alternative waveguide layer 604a. The waveguide layer 604a is similar to the waveguide layer 604 of the optical module 601 described above. However, in this case, the angled side faces 612a, 614a are substantially parallel to each other. In addition, the laser diode 602 is mounted on a plane which is perpendicular to the plane on which the image sensor 606 is mounted. It will be understood that, if the laser diode 602 and image sensor 606 are to be mounted on the same circuit board, it should be flexible to allow the laser 602 and sensor 606 to be mounted on perpendicular planes.

In the embodiment shown in FIG. 11, radiation 624 is emitted by the laser 602 along a first principal optical axis 632a towards the first angled side face 612a. The first side face 612a is angled with respect to the principal optical axis 632a of the laser radiation such that, when the radiation enters the waveguide layer 604a (which has a larger refractive index than the air or vacuum between the laser diode 2 and the waveguide layer 604a), the radiation is refracted along a second principal optical axis 632b towards the TIR surface 618a. The radiation is then totally internally reflected by the TIR surface 618a along a third principal optical axis 632c towards the second angled face 614a. Finally, the second angled face 614a totally internally reflects the radiation 624 along a fourth principal optical axis 632d towards the imaging surface 622 of the image sensor 606. User input is provided to the optical navigation device 601a by frustrated total internal reflection as described above. It should be understood that, as above, a reflective aluminum coating may be applied to the side face 614a to improve its reflectivity.

As the laser diode 602 and the image sensor 606 are mounted on perpendicular planes, they have principal optical axes 632a, 632d which are substantially perpendicular to each other. However, it will be understood that any angle may be formed between the principal optical axes 632a, 632d as long as the laser 602, waveguide layer 604, and image sensor 606 are together arranged to direct radiation emitted by the laser onto the imaging surface 622 at least partly by total internal reflection of the laser radiation 624 by the TIR surface 618a.

In another embodiment, the optical module 112 used in the key may alternatively or additionally comprise one or more Single Photon Avalanche Diodes (SPADs) as photo detectors. The idea that a SPAD may be used as in a ranging application is borne out by the application of a Phase Shift Extraction Method for range determination, although alternative methods exist for range determination using SPADs based on direct time of flight measurement. The term ranging in this application is intended to cover all ranging devices and methods including but not limited to ranging devices, proximity devices, accelerometers, etc. Ranging can occur in a number of applications, including proximity detection which is relatively easy to implement and inexpensive; laser ranging, which is more complex and costly than a proximity detector; and three-dimensional imaging, which is a high-end application that could be used to recognize gestures and facial expressions.

A proximity sensor is the most basic of the ranging applications. At its simplest, the sensor is capable of indicating the presence or absence of a user or object. Additional computation and illuminator complexity can provide enhanced data such as the range to an object. A typical range is of the order 0.01 m to 0.5 m. In a simple proximity sensor the illumination source could be a modulated LED at a wavelength of about 850 nm.

The next application group is that of laser ranging, where the illumination source is a modulated diode laser. Performance can range from <1 cm to 20 m range (and higher for top end systems) with millimeter accuracy. Optics requirement may be enhanced with hemispherical lenses and narrow bandpass filters. A near-field return may result in the introduction of parallax error, i.e. movement of the returned laser spot over the sensor pixel array dependent on distance to object. To address these problems, the ranger includes calibration functions to enable the subtraction of the electronic and optical delay through the host system. The illumination source wavelength may be visible so that the user can see what is being targeted, and is typically around 635 nm.

The third application group is that of 3D cameras. In this application a pixel array is used to reduce mechanical scanning of the array. Systems may be based on a number of different architectures. Both time of flight (TOF) and modulated illuminator based architectures are used, however, the latter is more robust to ambient light, and thus, fits best with established photodiode construction. Additional features, such as face and gesture recognition, are applications of this type of ranging device.

Most optical ranging implementations use either stereoscopic, structured light, direct time of flight, or phase extraction methods to ascertain the range to a target. Stereoscopic approaches use two conventional cameras and may have a relatively heavy computation overhead to extract range. The structured light scheme uses diffractive optics, and the range is computed using a conventional camera based on how a known projected shape or matrix of spots is deformed as it strikes the target. The direct time of flight (TOF) method uses a narrow pulsed laser, with a time-digital converter (TDC) measuring the difference in time between transmission and first photon reception. Commonly, a 'reverse mode' is employed, where the TDC measures the back-portion of time, i.e. the time from first photon reception to next pulse transmission. This scheme reduces system activity to occasions where a photon is detected, and is, therefore, well matched to tightly controlled, low photon flux levels and medical applications, such as fluorescent lifetime microscopy (FLIM).

The phase extraction method may be the most commonly used method as it is typically well suited to systems which implement computation of the generalized range equation using existing photodiode technology. It may also be robust to background ambient light conditions, and may be configured to allow for varying illuminator modulation wave-shapes (i.e. sinusoidal or square). This scheme is typically favored for SPADs in proximity detection applications.

The present embodiments take advantage of the fact that the phase extraction method system incorporates an inherent ambient light level detection function which may be used in conjunction with a SPAD for many applications, such as a keyboard with no moving parts based on a plurality of proximity detectors. It may be important to understand the range equation derivation, as it indicates the ease of applicability of SPADs to phase extraction proximity detection and ranging approaches. It also aids in the understanding of inherent features, such as ambient light metering and measuring a depth of interest for a specific purpose.

Distance is determined from the speed of light and TOF, as follows:

$$s=ct$$

Where s is distance, c the speed of light and t is time. For a ranging system however, the distance is doubled due to the fact there are send and receive paths. As such the distance measured in a ranging system s is given by:

$$s = \tfrac{1}{2} c t$$

The time shift component (='t') due to the photon TOF, is dependent on the modulation frequency and phase shift magnitude of the waveform.

$t$ = % shift of the returned waveform $\times t_{mod\_period}$ and if $t_{mod\_period} = 1/f_{mod}$:

$$\Rightarrow t = \frac{\phi}{2\pi} \circ \frac{1}{f}$$

$$\Rightarrow t = \frac{\phi}{2\pi \circ f}$$

The units are in radians. Then by substituting the above equation back into the starting equation, the 'range equation' is expressed as:

$$\Rightarrow s = \frac{c \circ \phi}{4\pi \circ f}$$

The critical component in this equation is $\phi$, which is the unknown component of the % shift of the returned waveform. The following section discusses how this can be determined.

Figure 12A:
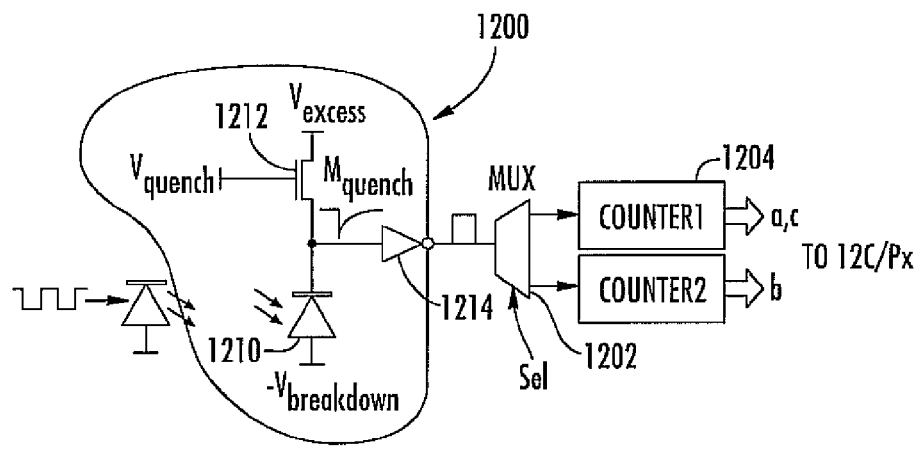
FIG. 12A is a diagram of a SPAD device in accordance with the present invention.
Figure 12B:
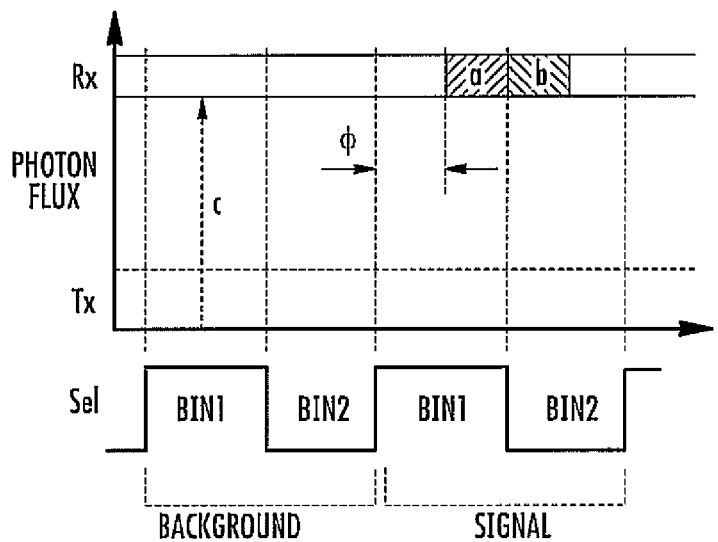
FIG. 12B is a timing diagram corresponding of the SPAD device in FIG. 12A.

Since the values of c, f and n are all constants, the range result scales with $\phi$, (the % shift of the received light waveform in relation to that which was transmitted). FIG. 12 demonstrates how $\phi$ may be determined for a system employing a square wave modulated illuminator. The transmitted and received waveforms are shifted from one another by $\phi$. By measuring the photons that arrive in "a" and "b" in bins 1 and 2, respectively, the value of $\phi$ can be determined as follows:

$$\frac{\phi}{2\pi} = \frac{b_{count}}{(a+b)_{count}}$$

In this type of system there is a range limit set by the illuminator modulation frequency, which is known as the unambiguous range. Photons received from targets that are further away than this range can introduce an aliasing error by erroneously appearing in a legitimate bin for a subsequent measurement. Since determination of range is enabled by the modulation process, it is desirable to increase the number of edges of the modulation waveform to accumulate data for averaging purposes as fast as possible. However, a high modulation frequency may lower the unambiguous range and introduces more technical complexity in the illuminator driver circuitry.

Therefore, two or more different modulation frequencies may be interleaved or used intermittently to reduce or negate the impact of aliased photons via appropriate data processing. FIG. 12 illustrates a possible implementation of a SPAR based proximity sensor with an associated waveform diagram. FIG. 12 shows a SPAD 1200 connected to a multiplexer 1202. The output from the multiplexer passes through counters 1 and 2 (204). The SPAD device shown generally at 1200 is of a standard type, including a photo diode 1210, a p-type MOSFET 1212, and a NOT gate 1214.

The timing waveforms are shown to represent the relative photon arrival magnitudes. It can be seen that an extra phase has been added to enable computation of the background ambient light level offset 'c', although this can be significantly reduced by the use of a narrow optical band-pass filter matched to the illuminator wavelength if desired. The element 'c' is then accommodated in the computation of received light phase shift $\phi$. The computed results for a, b, c are determined and written into either a temporary memory store or an I2C register. The computation of the phase shift $\phi$, is calculated as follows:

$$\phi = \frac{a_{count} - c}{(a+b)_{count} - 2c}$$

The predetermined selection of modulation frequency is performed by dedicated logic or host system which selects a suitable frequency or frequencies for the application of the range sensor. The range sensor of FIG. 12 may be dependent on the amount of light that can be transmitted on to the scene, system power consumption, and the target reflectivity.

Since the system shown in FIG. 12 computes the background light condition to ascertain the offset of the returned light pulse from the target, ambient light metering is included. A simplified timing scheme may be employed if the ambient light level data is desired, since the target illumination cycle may not be desired. If a narrow band IR filter is employed in the optical path, the value of c will represent the content of the filter passband. This can then be extrapolated to an approximation of the general ambient light conditions.

Figure 13:
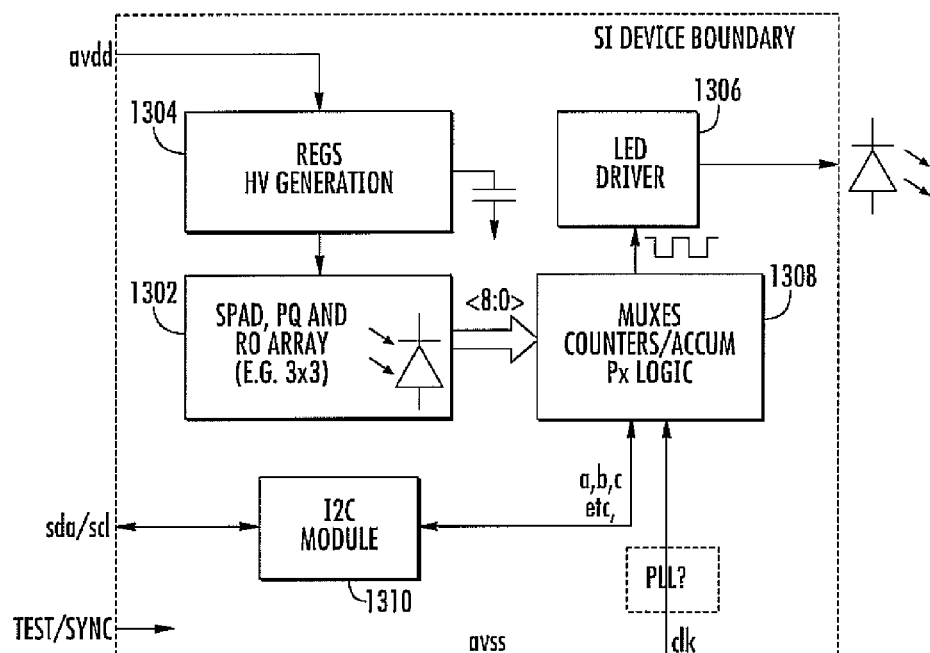
FIG. 13 is a block diagram of a proximity detector in accordance with the present invention.

Referring to FIG. 13, a block diagram of a proximity sensor is shown. The proximity sensor 1300 includes SPAD function and the quenching thereof in block 1302. The quenching can be passive as shown or of any other suitable type. The bias voltage for the SPAD may be provided by a charge pump or any other suitable device 1304. The sensor module also includes an LED or other illumination source and an associated driver 1306 so that the desired modulation is applied to the illumination source.

The sensor may include a distance computation logic module to determine range. Alternatively, this can be located in a host device in which the range sensor is used. The sensor also includes multiplexers and counters 1308, and a storage means 1310 or storage device, such as an I2C module. The sensor may also include a phase locked loop (PLL) for clocking and subsequent timed signal generation purposes.

The power consumption of SPADs and their readout circuits may be dependent on the incident photon arrival rate. The average power consumption of a ranging system may be reduced by using power saving modes, such as pulsed on/off operation, at a rate of ~10 Hz, for example, at the expense of target motion distortion.

The sensor may be implemented on a 1 mm$^2$ die size, and the I2C module may also be implemented on an appropriate die. The sensor may include an optical package, an integral IR bandpass Filter (either coating or inherent in the optical elements), and an optimal field of view of about 30°. As the sensor may not intended be to "create an image," but is instead used so that as many photons as possible are detected, the optics may be made from injection molded hemispherical elements.

The illuminator source should ideally be of a non-visible wavelength, for example, in the near infra red (NIR) band, such as 850 nm. The proximity sensor has been described with reference to a relatively simple low cost system, although it will be appreciated that for certain applications, the laser ranging and 3D camera technologies discussed above may be used. As previously indicated the proximity sensor may be very versatile and may be used in a vast array of different applications.

The measurement of photons that arrive in "a" and "b" in bins 1 and 2, respectively, and hence the value of $\phi$ may be determined by a data extraction algorithm which is performed on the output of the optical module 112. Thus, the detection of an object in proximity to the optical key generates a keystroke signal in a similar manner to pressing a key of a conventional keyboard.

For all types of photo detectors and for each individual optical key, the movement of the user's finger 100 (or an object) is also tracked and a motion vector determined in addition to determining if a keystroke signal is to be generated. The motion vectors and rate of movement can then be translated into an appropriate control action for a mobile communications device or mobile computer, for example. Each movement may be used to produce a different output from the optical module. For example, touching a key may result in a first output signal for the device; moving the pointer from left to right may result in a second output signal; and moving the pointer up and down may result in a third output signal. It will be appreciated that other movement may also be detected for an individual key, such that each movement or touch may result in a different output signal. The output signal may in turn be used to generate different action or controls for the device. For example, touching the key may result in a lower case letter being recognized as the input, while a left to right movement over the same key may result in a capital letter. The variations are endless.

Figure 1C:
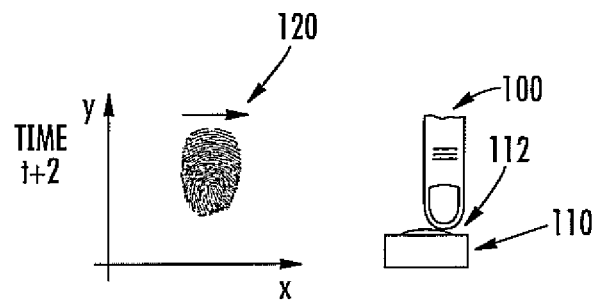
Figure 1D:
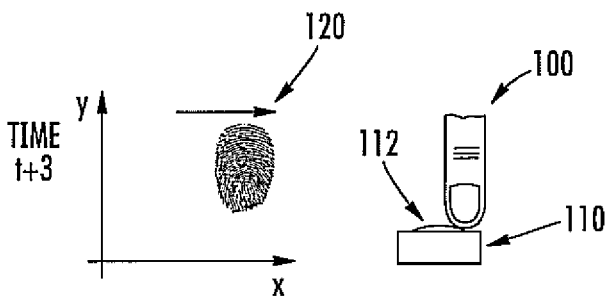

As shown in FIGS. 1C and 1D, motion of the finger 100 can be derived from location information and can be used to trigger additional inputs and/or commands, which may be user customizable and/or system defined. In the present example of an optical key, the movement of a finger 100 or other pointer may be detected by processing the signal from the optical module. If the optical module of the key comprises standard photo detectors, the standard photo detectors can be used to detect motion in 1, 2, or 3 dimensions depending on the complexity thereof. If the optical module of the key comprises SPADs, the SPADs can be used to detect motion in 1, 2, or 3 dimensions depending on the complexity thereof. If the optical module of the key comprises optical navigation sensors with imaging which rely on FTIR, the optical navigation can be used to detect motion in 1 or 2 dimensions depending on the complexity thereof.

Figure 14:
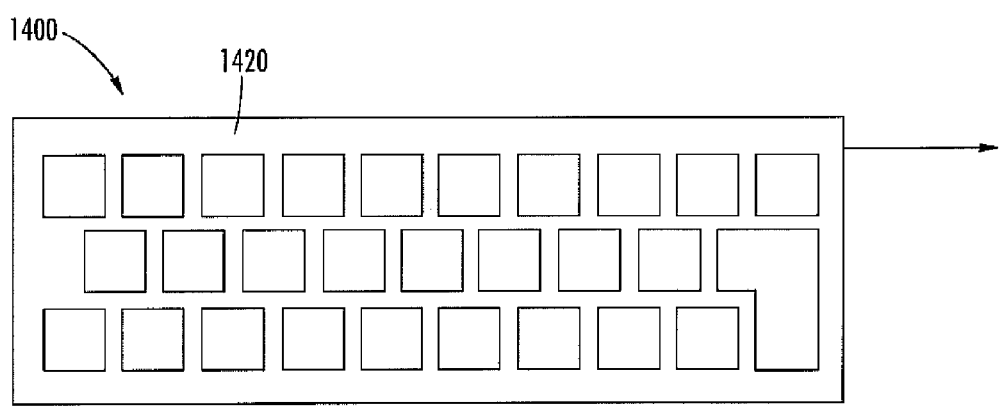
FIG. 14 shows a keyboard comprising optical keys in accordance with the present invention.

FIG. 14 shows a keyboard 1400 comprising a plurality of optical keys in accordance with the present disclosure. As noted above, the word keyboard when used herein is intended to encompass all keyboards and keypads. The form and key layout generally resemble that of a conventional keyboard or keypad to take advantage of user familiarity with existing keyboards. In this embodiment, the keys 1420 comprise optical modules. However, the keyboard may also comprise a mix of keys comprising optical modules and other keys, such as standard keys or any other type of key. Each optical key may be associated with a plurality of key stroke signals it can generate when activated by a user.

Figure 15A:
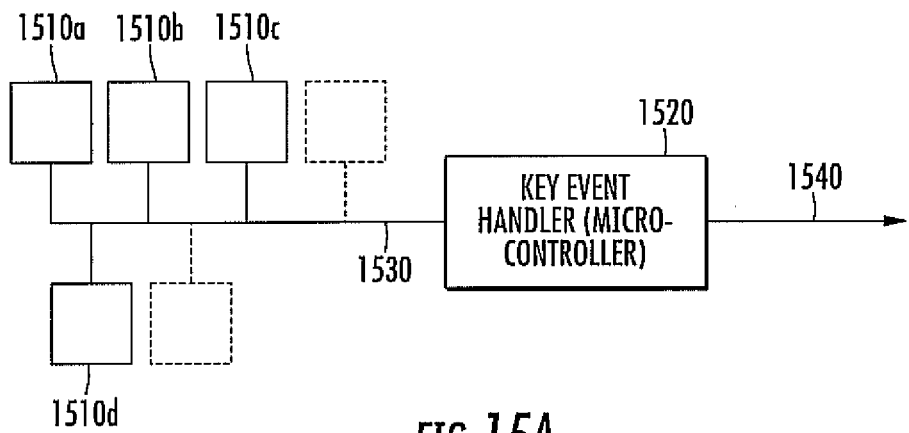
FIGS. 15A and 15B are schematic diagram illustrating the connection between the optical keys and a key event handler in accordance with the present invention.

As shown in FIG. 15A, the outputs from the optical keys 1510 are electrically connected to a key event handler 1520 in parallel with each other via a bus 1530. The key event handler 1520 generates the appropriate keyboard events based on the optical module output and outputs information and/or commands to the host system via interface 1540. The interface 1540 can be an I2C, SPI, USB, or PS2 or any other similar interface.

Figure 15B:
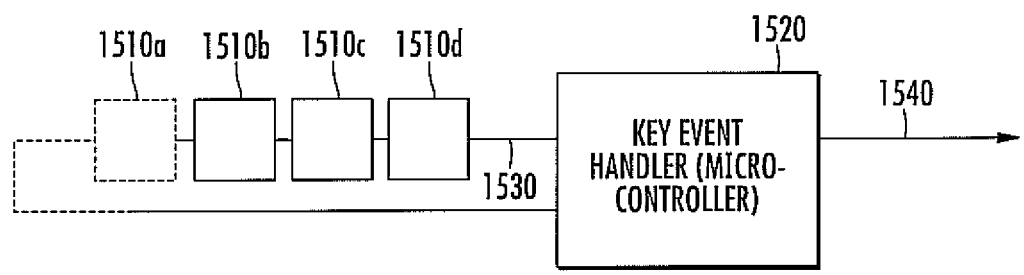

Alternatively as shown in FIG. 15B, the outputs from the optical keys 1510 are electrically connected to a key event handler 1520 in a daisy-chain serial configuration via a bus 1530. The key event handler 1520 generates the appropriate keyboard events based on the optical module output and outputs information and/or commands to the host system via interface 1540. The interface 1540 can be a USB or PS2 or any other similar interface.

Each optical key 1510 is associated with a register indicating whether a keystroke has been detected or not. The key event handler 1520 is configured to determine the optical module to generate an input to a device when at least one of the optical modules has been activated. The key event handler 1520 preferably sequentially polls the optical keys 1510 at a relatively high speed and determines from the output of the optical module if a keystroke signal is to be generated by that optical module.

If a keystroke signal is to be generated for a particular optical key, the key event handler 1520 selects a keystroke signal from the plurality of key stroke signals associated with that optical key. This selection may be preferably based on how the optical module of the optical key has been activated. Activation of the optical module may be at least in part dependent upon whether the user's finger is moving, the direction of the motion, or the position of the user's finger. The keystroke signal may then be used by the host system to select the appropriate input/command associated with a particular keystroke signal.

For example, a key for '4' on a keyboard can be assigned keystroke signals equivalent to that produced by i) pressing "4", ii) pressing shift and "4", and iii) pressing Alt Gr, or Ctrl+Alt, and "4" on a standard QWERTY keyboard. The user can select which keystroke signal to produce based upon whether their finger is moving, the direction of the motion, or the position of the user's finger. For example, by not moving their finger the user can select a keystroke signal equivalent to that produced by pressing "4" on a standard QWERTY keyboard. In addition, a right swipe can be used to select a keystroke signal equivalent to that produced by pressing shift and "4" on a standard QWERTY keyboard. This will allow the characters "4", "$", and "€" to be output with a single user action.

Sequential scanning through the key array will avoid keystroke conflicts where more than one key is held simultaneously. A relatively high scanning speed may be used to determine whether a key has been pressed or continuously held. The scanning speed may be adjusted depending upon application. The fastest touch typist will typically input less than 200 words per minute. Thus, the likely minimum time between keystrokes per second will likely be 60 seconds divided by 200 (words per minutes) multiplied by 8, which is the average number of keystrokes per word (i.e. 60/(200×8)), which equates to 37.5 ms per keystroke. Thus, the system cycles through all the keys of a keyboard in 37.5 ms or under to monitor each key quickly enough so that a keystroke is not missed by the system. For example, a keyboard with 104 keys can be scanned at a rate of 360 μs per key, and a keyboard with 12 keys can be scanned at a rate of 3.1 ms.

At high scanning speeds it may be assumed that two or more detected keystrokes detected one after another for any given key represents a continuous press of that key. In addition, relatively high scanning speeds make sequential detections of keystrokes appear to the user as simultaneous detections of keystrokes.

Figure 16:
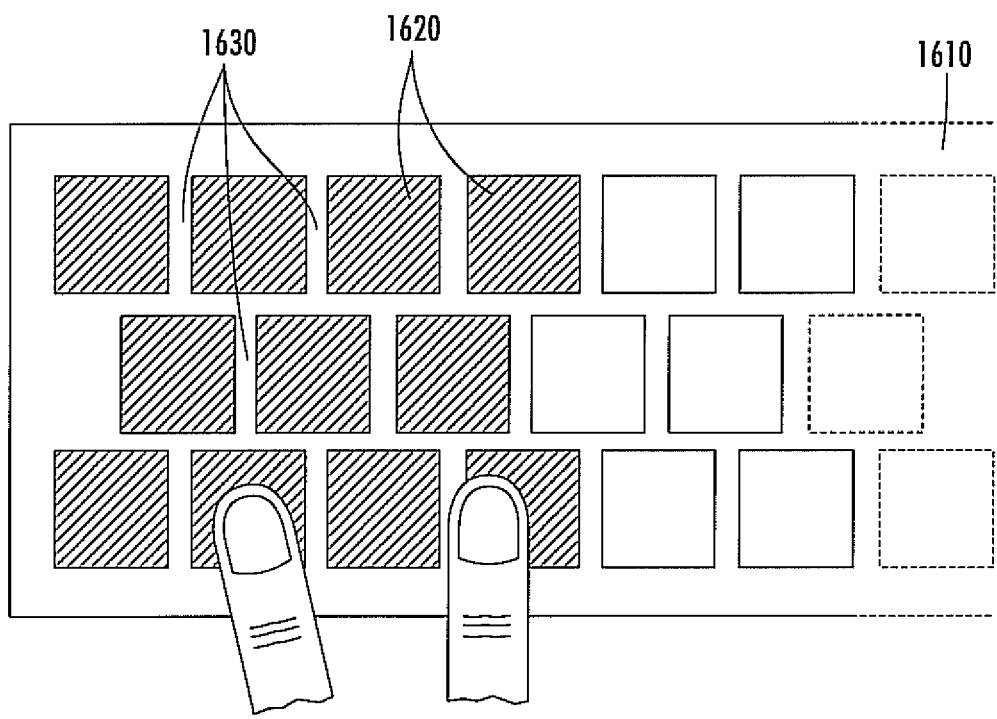
FIG. 16 is a schematic diagram of a keyboard including optical keys arranged in a sensing area in accordance with the present invention.

As shown in FIG. 16, optical keys 1620 may be used to replace a subset of the keys 1610 (e.g., for certain commonly used modifier keys, such as shift, ctrl & alt, etc.). Alternatively, optical keys 1620 may be used to replace keys 1610 if desired.

As described above, each individual optical key 1620 may be assigned several commands which are executed by a keystroke or directional swipes. For example, a right swipe on the "1" key can be programmed to provide a keystroke signal equivalent to that produced by the simultaneous pressing of the Shift key and the "1" key on a standard QWERTY keyboard. This will allow a "!" character to be output with a single user action.

In FIG. 16, the optical keys 1620 are arranged in a single continuous sensing area which, in addition to providing individual keys, can also be used as a single area for navigational purposes.

In practice, there may be a 'dead zone' 1630 between each optical key 1620 as a result of the optical module having a bezel area and the optical module's field of view. To address this, interpolation may be performed to determine the position of an object over the continuous sensing area. The location of the object is measured at several different moments in time. From this information, the speed of the finger is derived, and this can be used when interpolating the position of the object to achieve a more smooth transition between the fields of view of adjacent optical keys 1620. The 2D sensing of the optical navigation module may be utilized by software developers to give the user more control over the system with less increase in space and complexity.

It will be appreciated that many variations of the embodiments may apply and are intended to be encompassed within the scope of the claims. It will also be appreciated that the input device described herein can be used with a large number of parent devices, either as a standalone input device connectable to the parent device, or formed as part of the present device. For example, the input device can be used in a mobile phone, laptop, personal computer, server, smart phone, game console, tablet computer, personal digital assistant (PDA), camera, or a digital audio player. The input device can also be used in other types of environments where a key pad is used, for example, access systems to a building or other location, biometric sensors, etc.

That which is claimed:

1. A keyboard comprising:
a plurality of optical keys, each optical key comprising an optical module, and an interaction surface;
each of said plurality of optical keys being configured to be activated based upon movement of a user's finger on or in a vicinity of the interaction surface;
said optical module being configured to
generate two images of the user's finger based upon the user's finger being on or in the vicinity of the interaction surface, the two images defining different finger ridge deformation patterns,
track movement of the user's finger based upon the different finger ridge deformation patterns by at least
determining when the tracked movement of the user's finger corresponds to a swipe movement based upon the different finger ridge deformation patterns caused by application of pressure by the user's finger, and
determining when the tracked movement of the user's finger corresponds to a key press movement based upon the different finger ridge deformation patterns caused by application of pressure by the user's finger, and
produce a first output when the tracked movement of the user's finger corresponds to the swipe movement and produce a second output different than the first output when the tracked movement corresponds to the key press movement.

2. The keyboard according to claim 1, further comprising a key event handler configured to receive the different outputs from each optical module and determine a sequence of movements and associated keys based upon the different outputs.

3. The keyboard according to claim 2, wherein said key event handler is configured to generate an output based upon the sequence of movements and associated keys.

4. The keyboard according to claim 2, further comprising a bus; and wherein said optical modules are electrically coupled in parallel with each other to said key event handler via said bus.

5. The keyboard according claim 2, further comprising a bus; and wherein said optical modules are electrically connected in a daisy-chained serial configuration to said key event handler via said bus.

6. The keyboard according to claim 2, wherein said plurality of optical keys are arranged in a single continuous sensing area; and wherein said key event handler is configured to determine, for navigational purposes, one of the movement and position of the user's finger in the single continuous sensing area.

7. The keyboard according to claim 6, wherein said key event handler is configured to interpolate the position of the user's finger moving over the single continuous sensing area when the user's finger is between two specific optical keys.

8. The keyboard according to claim 7, wherein said key event handler is configured to derive a speed of movement of the user's finger and interpolate the position of the user's finger based upon the speed of movement.

9. The keyboard according to claim 1, wherein said optical module is configured to be activated by at least one of detection of a position of the user's finger relative to the interaction surface, detection of movement of the user's finger, and detection of a direction of movement of the user's finger.

10. The keyboard according to claim 1, wherein said optical module comprises a photo detector array.

11. The keyboard according to claim 1, further comprising an illumination source configured to illuminate the interaction surface.

12. The keyboard according to claim 1, wherein said optical module comprises a waveguide layer.

13. The keyboard according to claim 1, further comprising a comparator configured to determine a motion vector from the two images based on differences between the two images.

14. An electronic device comprising:
a keyboard comprising
a plurality of optical keys, each comprising an optical module, and an interaction surface,
each of said plurality of optical keys being configured to be activated based upon movement of a user's finger on or in vicinity of the interaction surface,
said optical module being configured to
generate two images of the user's finger based upon the user's finger being on or in the vicinity of the interaction surface, the two images defining different finger ridge deformation patterns,
track movement of the user's finger based upon the different finger ridge deformation patterns by at least
determining when the tracked movement of the user's finger corresponds to a swipe movement based upon the different finger ridge deformation patterns caused by application of pressure by the user's finger, and determining when the tracked movement of the user's finger corresponds to key press movement based upon the different finger ridge deformation patterns caused by application of pressure by the user's finger, and produce a first output when the tracked movement of the user's finger corresponds to the swipe movement and produce a second output different than the first output when the tracked movement corresponds to the key press movement and generate an input for a device.

15. The electronic device according to claim 14, further comprising a key event handler configured to receive the different outputs from each optical module and determine a sequence of movements and associated keys based upon the different outputs.

16. The electronic device of claim 14, wherein the electronic device defines a computer.

17. The electronic device of claim 14, wherein the electronic device defines a telephone.

18. A method of generating an output from a keyboard, the keyboard comprising a plurality of optical keys each comprising an optical module and an interaction surface, each of the plurality of optical keys being configured to be activated based upon movement of a user's finger adjacent the interaction surface, the method comprising:

generating, when at least one of the plurality of optical modules has been activated by movement of the user's finger on or in the vicinity of the interaction surface, two images of the user's finger, the two images defining different finger ridge deformation patterns;

tracking movement of the user's finger based upon the different finger ridge deformation patterns by at least determining when the tracked movement of the user's finger corresponds to a swipe movement based upon the different finger ridge deformation patterns caused by application of pressure by the user's finger, and determining when the tracked movement of the user's finger corresponds to a key press movement based upon the different finger ridge deformation patterns caused by application of pressure by the user's finger; and from each optical module, generating a first output when the tracked movement of the user's finger corresponds to the swipe movement and generating a second output different than the first output when the tracked movement corresponds to the key press movement.

19. The method according to claim 18, further comprising passing the different outputs from each of the optical modules to a key event handler to determine a sequence of movements and associated keys.

20. The method according to claim 19, wherein the key events handler generates an output based on the sequence of movements and associated keys.

21. The method according to claim 18, wherein the plurality of optical keys are arranged in a single continuous sensing area; and wherein the method comprises determining at least one of the movement and a position of the user's finger in the single continuous sensing area for navigational purposes.

22. The method according to claim 21, further comprising interpolating the position of the user's finger moving over the single continuous sensing area when the user's finger is between two optical modules.

23. The method according to claim 22, further comprising deriving a speed of movement of the user's finger and using the speed of movement of the user's finger to interpolate the position of the user's finger.

24. A non-transitory computer-readable medium for generating an output from a keyboard, the keyboard comprising a plurality of optical keys each comprising an optical module and an interaction surface, each of the plurality of optical keys being configured to be activated based upon movement of a user's finger adjacent the interaction surface, the non-transitory computer-readable medium having computer-executable instructions for causing the keyboard to perform steps comprising:

generating, when at least one of the plurality of optical modules has been activated by movement of the user's finger on or in the vicinity of the interaction surface, two images of the user's finger, the two images defining different finger ridge deformation patterns;

tracking movement of the user's finger based upon the different finger ridge deformation patterns by at least determining when the tracked movement of the user's finger corresponds to a swipe movement based upon the different finger ridge deformation patterns caused by application of pressure by the user's finger, and determining when the tracked movement of the user's finger corresponds to a key press movement based upon the different finger ridge deformation patterns caused by application of pressure by the user's finger; and generating a first output when the tracked movement of the user's finger corresponds to the swipe movement and generating a second output different than the first output when the tracked movement corresponds to the key press movement.

25. The non-transitory computer-readable medium according to claim 24, wherein the computer-executable instructions are for causing the keyboard to perform the step of passing the different outputs from each of the optical modules to a key event handler to determine a sequence of movements and associated keys.

26. The non-transitory computer-readable medium according to claim 25, wherein the computer-executable instructions are for causing the keyboard to perform the step of generating outputs based upon the sequence of movements and associated keys.

27. The non-transitory computer-readable medium to claim 24, wherein the plurality of optical keys are arranged in a single continuous sensing area; and wherein the computer-executable instructions are for causing the keyboard to perform the step of determining at least one of the movement and a position of the user's finger in the single continuous sensing area for navigational purposes.

28. The non-transitory computer-readable medium according to claim 27, wherein the computer-executable instructions are for causing the keyboard to perform the step of interpolating the position of the user's finger moving over the single continuous sensing area when the user's finger is between two optical modules.

29. The non-transitory computer-readable medium according to claim 28, wherein the computer-executable instructions are for causing the keyboard to perform the step of deriving the speed of movement of the user's finger and using the speed of movement of the user's finger to interpolate the position of the user's finger.

* * * * *